US008742414B2

(12) United States Patent
Kim et al.

(10) Patent No.: US 8,742,414 B2
(45) Date of Patent: Jun. 3, 2014

(54) COMPOSITION FOR AN OXIDE THIN FILM, A PREPARATION METHOD OF THE COMPOSITION, A METHOD FOR FORMING AN OXIDE THIN FILM USING THE COMPOSITION, AN ELECTRONIC DEVICE INCLUDING THE OXIDE THIN FILM, AND A SEMICONDUCTOR DEVICE INCLUDING THE OXIDE THIN FILM

(71) Applicant: Industry-Academic Cooperation Foundation, Yonsei University, Seoul (KR)

(72) Inventors: Hyun Jae Kim, Seoul (KR); Woong Hee Jeong, Seoul (KR); You Seung Rim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/652,677

(22) Filed: Oct. 16, 2012

(65) Prior Publication Data

US 2013/0161620 A1    Jun. 27, 2013

(30) Foreign Application Priority Data

Dec. 27, 2011    (KR) .................. 10-2011-0143833

(51) Int. Cl.
*H01L 29/12*    (2006.01)
*H01L 21/00*    (2006.01)
*H01B 1/06*    (2006.01)

(52) U.S. Cl.
USPC ............................ 257/43; 438/104; 252/521.6

(58) Field of Classification Search
CPC .................. H01I 21/02172; H01L 21/02403; H01L 29/786; H01L 29/7869; H01L 29/2908; H01L 21/02565; H01L 21/02172
USPC ................ 257/43, 57, E21.09, E29.273; 252/521.5, 519.5, 519.3, 521.6; 438/104, 479, 758
See application file for complete search history.

(56) References Cited

U.S. PATENT DOCUMENTS

| | | | |
|---|---|---|---|
| 2008/0286907 A1 | 11/2008 | Li et al. | |
| 2009/0173938 A1 | 7/2009 | Honda et al. | |
| 2009/0206341 A1 | 8/2009 | Marks et al. | |
| 2010/0125039 A1* | 5/2010 | Banerjee et al. | 502/417 |
| 2010/0210069 A1* | 8/2010 | Seon et al. | 438/104 |
| 2010/0251936 A1* | 10/2010 | Kim et al. | 106/286.6 |
| 2011/0227064 A1* | 9/2011 | Park et al. | 257/43 |
| 2012/0168747 A1* | 7/2012 | Kim et al. | 257/43 |

FOREIGN PATENT DOCUMENTS

| | | |
|---|---|---|
| KR | 1020090012782 A | 2/2009 |
| KR | 1020110022479 A | 3/2011 |

* cited by examiner

*Primary Examiner* — Nikolay Yushin
(74) *Attorney, Agent, or Firm* — Carter, DeLuca, Farrell & Schmidt LLP

(57) ABSTRACT

Provided are a composition for an oxide thin film, a preparation method of the composition, a method for forming an oxide thin film using the composition, an electronic device including the oxide thin film, and a semiconductor device including the oxide thin film. The composition for the oxide thin film includes a metal precursor and nitric acid-based stabilizer. The metal precursor includes at least one of a metal nitrate, a metal nitride, and hydrates thereof.

14 Claims, 9 Drawing Sheets

COMPOSITION FOR AN OXIDE THIN FILM, A PREPARATION METHOD OF THE COMPOSITION, A METHOD FOR FORMING AN OXIDE THIN FILM USING THE COMPOSITION, AN ELECTRONIC DEVICE INCLUDING THE OXIDE THIN FILM, AND A SEMICONDUCTOR DEVICE INCLUDING THE OXIDE THIN FILM

CROSS-REFERENCE TO RELATED APPLICATIONS

This U.S. non-provisional patent application claims priority under 35 U.S.C. §119 to Korean Patent Application No. 10-2011-0143833, filed on Dec. 27, 2011, the entirety of which is incorporated by reference herein.

BACKGROUND

Embodiments according to the inventive concept relate to a composition for an oxide thin film, a method for forming the oxide thin film using the composition, an electronic device including the oxide thin film, and a semiconductor device including the thin oxide film.

Recently, various researches have been conducted for an oxide semiconductor substituting for a silicon-based semiconductor device. A binary oxide and/or ternary oxide compounds based on indium oxide ($In_2O_3$), zinc oxide (ZnO) and/or gallium oxide ($Ga_2O_3$) have been developed as the oxide semiconductor in a material aspect. In a process aspect, a solution process instead of a conventional vacuum deposition process has been developed for the oxide semiconductor.

The oxide semiconductor may exhibit an amorphous state as hydrogenated amorphous silicon. However, since the oxide semiconductor has more excellent mobility (5~10 $cm^2/Vs$) than the hydrogenated amorphous silicon, the oxide semiconductor may be suitable for a high-definition liquid crystal display (LCD), an active matrix organic light emitting diode (AMOLED) display, etc. Additionally, a manufacture technique of the oxide semiconductor using the solution process has a lower costs characteristic than the vacuum deposition process of high costs. However, a method of forming the oxide thin film using a conventional solution process needs a high temperature-annealing process of 450° C. or more. It is difficult to apply the annealing process of 450° C. or more to a $8^{th}$ generation or more of a large glass substrate as well as a plastic substrate.

SUMMARY

Embodiments of the inventive concept may provide a method of forming an oxide semiconductor using a low temperature process, a composition for the same, an oxide semiconductor device formed by the low temperature process, and an electronic device including oxide semiconductor.

In one aspect, a composition for an oxide thin film includes: a metal precursor including at least one of a metal nitrate, a metal nitride, and hydrates thereof; and a nitric acid-based stabilizer.

In another aspect, a method for forming an oxide thin film includes: depositing a composition for the oxide thin film on a substrate, the composition including a metal precursor and a nitric acid-based stabilizer, and the metal precursor including at least one of metal nitrate, metal nitride, and hydrates thereof; and annealing the substrate having the coated composition at a temperature within a range of 100° C. to 450° C.

In still another aspect, an electronic device includes: an oxide thin film formed by the method for forming the oxide thin film; a gate electrode disposed on the oxide thin film; and a source electrode and a drain electrode electrically connected to the oxide thin film and disposed at both sides of the gate electrode, respectively.

In yet another aspect, a semiconductor device includes: an oxide thin film formed on a flexible substrate or a glass substrate by the method for forming the oxide thin film.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
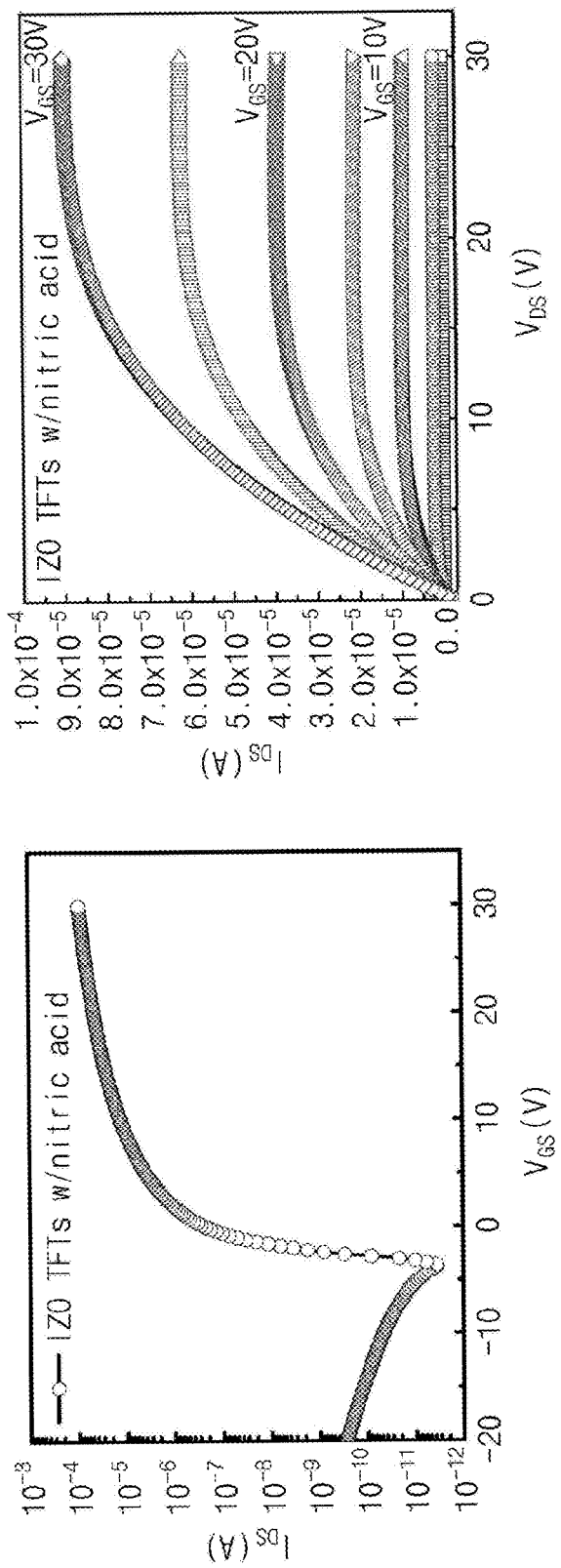
FIG. 1 shows a transfer curve and an output curve of a InZnO thin film transistor manufactured under an annealing process of 300° C. according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

A method of forming the oxide thin film using a conventional solution process needs a high temperature-annealing process of 450° C. or more. It is difficult to apply the annealing process of 450° C. or more to a $8^{th}$ generation or more of a large glass substrate as well as a plastic substrate.

Thus, embodiments of the inventive concept suggest or develop a method for forming an electronic device applied with an oxide material which is performed under a temperature (e.g., about 450° C. or less) capable of being applied to a large area glass substrate or plastic substrate by controlling a precursor of a composition for an oxide thin film and/or by controlling a stabilizer.

Composition for Oxide Thin Film

A composition for an oxide thin film according to some embodiments of the inventive concept includes a metal precursor proving an oxide thin film source and a stabilizer. The metal precursor may be easily dissolved in a solvent by the stabilizer. In some embodiments of the inventive concept, a nitric acid-based stabilizer is used as the stabilizer. The nitric acid-based stabilizer promotes evaporation of a solution and decomposition of the metal precursor. And the nitric acid-based stabilizer promotes oxidation and hydration. The nitric acid-based stabilizer enables the formation of a good quality and pure oxide thin film not including carbon. The nitric acid-based stabilizer according to the inventive concept enable the good quality oxide thin film to be formed by an annealing process of a low temperature, for example, within a range of about 100° C. to about 450° C. Particularly, the low temperature may be within a range of about 200° C. to about 300° C. More particularly, the low temperature may be about 200° C. or less.

In some embodiments of the inventive concept, nitric acid and/or ammonium nitrate may be used as the nitric acid-based stabilizer. However, the inventive concept is not limited thereto. Particularly, the nitric acid may be used as the nitric acid-based stabilizer.

A metal in the metal precursor according to some embodiment of the inventive concept may include at least one of zinc, indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium.

The solvent dissolving the metal precursor according to some embodiments of the inventive concept may include at least one of isopropanol, 2-methoxyethanol, dimethylformaldehyde, ethanol, deionized water, methanol, acetylacetone, dimethylamineborane, and acetonitrile.

Various materials may be used as the metal precursor. Particularly, the metal precursor may include at least one of metal nitrate, metal nitride and hydrates thereof.

Zinc salts and hydrates thereof may be used as a zinc precursor. However, the inventive concept is not limited thereto. For example, the zinc precursor may include at least one of zinc nitrate, zinc nitride, zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, and hydrates thereof. Particularly, at least one of zinc nitrate, zinc nitride, and hydrates thereof may be used as the zinc precursor.

An indium precursor may include at least one of indium salts and hydrates thereof. However, the inventive concept is not limited thereto. For example, the indium precursor may include at least one of indium nitrate, indium nitride, indium Chloride, indium chloride tetrahydrate, indium fluoride, indium fluoride trihydrate, indium hydroxide, indium nitrate hydrate, indium acetate hydrate, indium acetylacetonate, indium acetate, and hydrates thereof. Particularly, at least one of indium nitrate, indium nitride, and hydrates thereof may be used as the indium precursor.

A tin precursor may include at least one of tin salts and hydrates thereof. However, the inventive concept is not limited thereto. For example, the tin precursor may include at least one of tin nitrate, tin nitride, tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin (IV) iodide, tin(IV) sulfide, tin(IV) tert-butoxide, and hydrates thereof. Particularly, at least one of tin nitrate, tin nitride, and hydrates thereof may be used as the tin precursor.

A gallium precursor may include at least one of gallium salts and hydrates thereof. The inventive concept is not limited thereto. For example, the gallium precursor may include at least one of gallium nitrate, gallium nitride, gallium phosphide, gallium(II) chloride, gallium(III) acetylacetonate, gallium(III) bromide, gallium(III) chloride, gallium(III) fluoride, gallium(III) iodide, gallium(III) nitrate hydrate, gallium (III) sulfate, gallium(III) sulfate hydrate, and hydrates thereof. Particularly, at least one of gallium nitrate, gallium nitride, and hydrates thereof may be used as the gallium precursor.

A zirconium precursor may include at least one of zirconium salts and hydrates thereof. However, the inventive concept is not limited thereto. For example, the zirconium precursor may include at least one of zirconium nitrate, zirconium nitride, zirconium acetate, zirconium(II) hydride, zirconium(IV) acetate hydroxide, zirconium(IV) acetylacetonate, zirconium(IV) butoxide solution, zirconium(IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium (IV) sulfate hydrate, zirconium(IV) tert-butoxide, and hydrates thereof. Particularly, at least one of zirconium nitrate, zirconium nitride, and hydrates thereof may be used as the zirconium precursor.

An aluminum precursor may include at least one of aluminum salts and hydrates thereof. However, the inventive concept is not limited thereto. For example, the aluminum precursor may include at least one of aluminum nitrate, aluminum nitride, aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, aluminum tert-butoxide, and hydrates thereof. Particularly, at least one of aluminum nitrate, aluminum nitride, and hydrates thereof may be used as the aluminum precursor.

A neodymium precursor may include at least one of neodymium salts and hydrates thereof. However, the inventive concept is not limited thereto. For example, the neodymium precursor may include at least one of neodymium nitrate, neodymium nitride, neodymium(II) iodide, neodymium(III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium(III) fluoride, neodymium(III) hydroxide hydrate, neodymium (III) iodide, neodymium(III) isopropoxide, neodymium(III) nitrate hexahydrate, neodymium(III) nitrate hydrate, neodymium(III) oxalate hydrate, neodymium(III) phosphate hydrate, neodymium(III) sulfate, neodymium(III) sulfate hydrate, and hydrates thereof. Particularly, at least one of neodymium nitrate, neodymium nitride, and hydrates thereof may be used as the neodymium precursor.

A scandium precursor may include at least one of scandium salts and hydrates thereof. However, the inventive concept is not limited thereto. For example, the scandium precursor may include at least one of scandium nitrate, scandium nitride, scandium acetate hydrate, scandium acetylacetonate hydrate, scandium chloride, scandium chloride hexahydrate, scandium chloride hydrate, scandium fluoride, scandium nitrate hydrate, and hydrates thereof. Particularly, at least one of scandium nitrate, scandium nitride, and hydrates thereof may be used as the scandium precursor.

A tantalum precursor supplying tantalum may include at least one of tantalum salts and hydrates thereof. However, the inventive concept is not limited thereto. For example, the tantalum precursor may include at least one of tantalum bromide, tantalum chloride, tantalum fluoride, and hydrates thereof.

A titanium precursor may include at least one of titanium salts and hydrates thereof. However, the inventive concept is not limited thereto. For example, the titanium precursor may include at least one of titanium nitrate, titanium nitride, titanium bromide, titanium chloride, titanium fluoride, and hydrates thereof. Particularly, at least one of titanium nitrate, titanium nitride, and hydrates thereof may be used as the titanium precursor.

A barium precursor may include at least one of barium salts and hydrates thereof. However, the inventive concept is not limited thereto. For example, the barium precursor may include at least one of barium nitrate, barium nitride, barium acetate, barium acetylacetonate, barium bromide, barium chloride, barium fluoride, barium hexafluoacetylacetonate, barium hydroxide, and hydrates thereof. Particularly, at least one of barium nitrate, barium nitride, and hydrates thereof may be used as the barium precursor.

A lanthanum precursor may include at least one of lanthanum salts and hydrates thereof. However, the inventive concept is not limited thereto. For example, the lanthanum precursor may include at least one of lanthanum nitrate, lanthanum nitride, lanthanum acetate, lanthanum acetylacetonate, lanthanum bromide, lanthanum chloride, lanthanum hydroxide, lanthanum fluoride, and hydrates thereof. Particularly, at least one of lanthanum nitrate, lanthanum nitride, and hydrates thereof may be used as the lanthanum precursor.

A manganese precursor may include at least one of manganese salts and hydrates thereof. However, the inventive concept is not limited thereto. For example, the manganese precursor may include at least one of manganese nitrate, manganese nitride, manganese acetate, manganese acetylacetonate, manganese bromide, manganese chloride, manganese fluoride, and hydrates thereof. Particularly, at least one of manganese nitrate, manganese nitride, and hydrates thereof may be used as the manganese precursor.

A chromium precursor may include at least one of chromium salts and hydrates thereof. However, the inventive concept is not limited thereto. For example, the chromium precursor may include at least one of chromium nitrate, chromium nitride, chromium acetate, chromium acetylacetonate, chromium bromide, chromium chloride, chromium fluoride, and hydrates thereof. Particularly, at least one of chromium nitrate, chromium nitride, and hydrates thereof may be used as the chromium precursor.

A strontium precursor may include at least one of strontium salts and hydrates thereof. However, the inventive concept is not limited thereto. For example, the strontium precursor may include at least one of strontium nitrate, strontium nitride, strontium acetate, strontium acetylacetonate, strontium bromide, strontium chloride, strontium fluoride, strontium hydroxide, and hydrates thereof. Particularly, at least one of strontium nitrate, strontium nitride, and hydrates thereof may be used as the strontium precursor.

An yttrium precursor may include at least one of yttrium salts and hydrates thereof. However, the inventive concept is not limited thereto. For example, the yttrium precursor may include at least one of yttrium nitrate, yttrium nitride, yttrium acetate, yttrium acetylacetonate, yttrium chloride, yttrium fluoride, and hydrates thereof. Particularly, at least one of yttrium nitrate, yttrium nitride, and hydrates thereof may be used as the yttrium precursor.

A cerium precursor may include at least one of cerium salts and hydrates thereof. However, the inventive concept is not limited thereto. For example, the cerium precursor may include at least one of cerium nitrate, cerium nitride, cerium (III) acetate hydrate, cerium(III) acetylacetonate hydrate, cerium(III) bromide, cerium(III) carbonate hydrate, cerium (III) chloride, cerium(III) chloride heptahydrate, cerium(III) fluoride, cerium(III) iodide, cerium(III) nitrate hexahydrate, cerium(III) oxalate hydrate, cerium(III) sulfate, cerium(III) sulfate hydrate, cerium(III) sulfate octahydrate, cerium(IV) fluoride, cerium(IV) hydroxide, cerium(IV) sulfate, cerium (IV) sulfate hydrate, cerium(IV) sulfate tetrahydrate, and hydrates thereof. Particularly, at least one of cerium nitrate, cerium nitride, and hydrates thereof may be used as the cerium precursor.

A hafnium precursor may include at least one of hafnium salts and hydrates thereof. However, the inventive concept is not limited thereto. For example, the hafnium precursor may include at least one of hafnium nitrate, hafnium nitride, hafnium chloride, hafnium fluoride, and hydrates thereof. Particularly, at least one of hafnium nitrate, hafnium nitride, and hydrates thereof may be used as the hafnium precursor.

A silicon precursor may include at least one of silicon nitride, silicon tetraacetate, silicon tetrabromice, silicon tetrachloride, and silicon tetrafluoride. Particularly, silicon nitride may be used as the silicon precursor.

According to some embodiments of the inventive concept, the composition for the oxide thin film may include the aforementioned nitric acid-based stabilizer and any combination of the aforementioned metal precursors. Kinds of the metal precursors may be suitably selected to obtain desired electrical characteristics of the oxide thin film. In other words, the oxide thin film may be a conductor, a semiconductor, or an insulator according to the kind of the metal precursor.

For example, if zinc nitrate and indium nitrate are used as the metal precursor, the formed oxide thin film may be used as a channel layer of a thin film transistor. On the other hand, if aluminum nitrate is used as the metal precursor, the formed oxide thin film may be used as a gate insulating layer of a thin film transistor.

Thus, in some embodiments, if the metal precursor is suitably controlled, the channel layer and the gate insulating layer may be formed simultaneously or sequentially formed by the solution process.

Additionally, if a composition ratio (e.g., a molar ratio, an atomic number ratio, and/or a molar concentration ratio) between the metal precursors is suitably controlled, it is possible to form the thin film transistor having a desired characteristic (showing a desired characteristic curve).

For example, a molar concentration of the metal precursor may be within a range of about 0.1M to about 10M.

For example, if the indium precursor and the zinc precursor are used as the metal precursor, the molar ratio of the indium precursor to the zinc precursor may be within a range of 1:1 to 9:1.

For example, the nitric acid-based stabilizer may have the same molar concentration as the metal precursor in the composition for the oxide thin film.

For example, a molar ratio of the nitric acid-based stabilizer to the metal precursor may be within a range of 1:1 to 10:1.

Coating and Annealing

The composition for the oxide thin film may be deposited on a substrate by a screen printing method, a spin coating method, a dip coating method, a spray method, roll-to-roll method, and/or ink-jet method.

After the composition for the oxide thin film is deposited on the substrate, an annealing process for the formation of the oxide thin film may use a furnace, a hot plate, and/or a rapid thermal annealing process. An atmosphere of the annealing process may be applied with a general air atmosphere, a vacuum atmosphere, a vapor atmosphere, a nitrogen atmosphere, a hydrogen atmosphere, an oxygen atmosphere, a reduction atmosphere, and/o be a pressurized atmosphere. The annealing process may be a laser annealing process, an ultraviolet ray (UV) annealing process, and/or a plasma annealing process.

The substrate on which the composition for the oxide thin film is coated may be selected from various kinds of substrates such as a silicon substrate, a plastic substrate, a glass substrate, and a flexible substrate according to application fields.

First Embodiment: Precursor Solution for IZO(InGaZnO) Thin Film 2-methoxyethnal, indium nitrate hydrate, zinc nitrate, and nitric acid were prepared. The 2-methoxyethnal was used as a solvent. The indium nitrate hydrate and zinc nitrate were used as the precursor solution. The nitric acid was used as a stabilizer. A composition ratio of indium to zinc was 3:1 (i.e., the molar ratio of the indium nitrate hydrate to zinc nitrate was 3:1). The molar concentration of the precursor solution was 0.3M. After the indium nitrate hydrate and the zinc nitrate were mixed and the solvent was added to the mixed solution as to satisfy the molar ratio and the molar concentration. Thereafter, the nitric acid of the same molar concentration as the precursor solution was added to the solution having the precursor solution and the solvent. The resultant mixed solution for the oxide thin film was stirred at a temperature of about 50° C. at 300 rpm for 1 hour. The stirred oxide solution was stabilized for about a day.

Second Embodiment: Precursor Solution for IZO(InZnO) Thin Film

The composition ratio of indium to zinc was variously changed within a range of 1:1 to 10:1 to form precursor solutions by the same method as the first embodiment.

Third Embodiment: Precursor Solution for AlO Thin Film 2-methoxyethnal, aluminum nitrate and nitric acid were prepared. The 2-methoxyethnal was used as a solvent, the aluminum nitrate was used as a precursor solution, and the nitric acid was used as a stabilizer. The precursor solution was added into 2-methoxyethnal used as the solvent. Here, the molar concentration of the precursor solution was 0.3M. Thereafter, the nitric acid was added to have the same molar concentration as the precursor solution. The resultant mixed solution for the oxide thin film was stirred at a temperature of about 50° C. at 300 rpm for 1 hour. The stirred oxide solution was stabilized for about a day.

Comparison Embodiment

For comparison with the precursor solutions according to embodiments of the inventive concept, acetic acid was used as a stabilizer to form a precursor solution for IZO thin film by the same method as the first embodiment.

Manufacture of Thin Film Transistor

Thin film transistors are formed using the precursor solutions formed as described above.

A conductive material (e.g., molybdenum-tungsten (multimode optical waveguide)) is deposited on a glass substrate with a thickness of about 2000 Å and then is patterned by a photolithography process and an etching process to form a gate electrode. Silicon oxide having a thickness of about 2000 Å is deposited by a chemical vapor deposition method to form a gate insulating layer. The precursor solution formed according to the aforementioned embodiments is deposited on the gate insulating layer and then an annealing process is performed. Here, the deposition of the precursor solution may be performed by a spin coating method, a dip coating method, a ink jet printing method, a screen printing method, a spray method, or a roll-to-roll method. The annealing process after the deposition of the precursor solution may use a furnace, a hot plate, or a rapid thermal annealing method. The annealing process is performed at about 300° C. for about 5 minutes. Subsequently, a conductive material (e.g., tantalum) is stacked and then is patterned to form a source electrode and a drain electrode.

Evaluation

FIG. 1 shows electrical characteristics of the thin film transistor formed using the precursor solution for the IZO thin film according to the first embodiment. Referring to FIG. 1, as illustrated in a transfer curve of the transistor, a field effect mobility is 2 $cm^2/Vs$, a threshold voltage is 7V, a on/off ratio is $2.5 \times 10^7$, and a S-factor is 0.57 V/decade. On the other hand, an output curve shows the function of the thin film transistor which has a linear region and a saturation region surely distinguished from each other.

Figure 2:
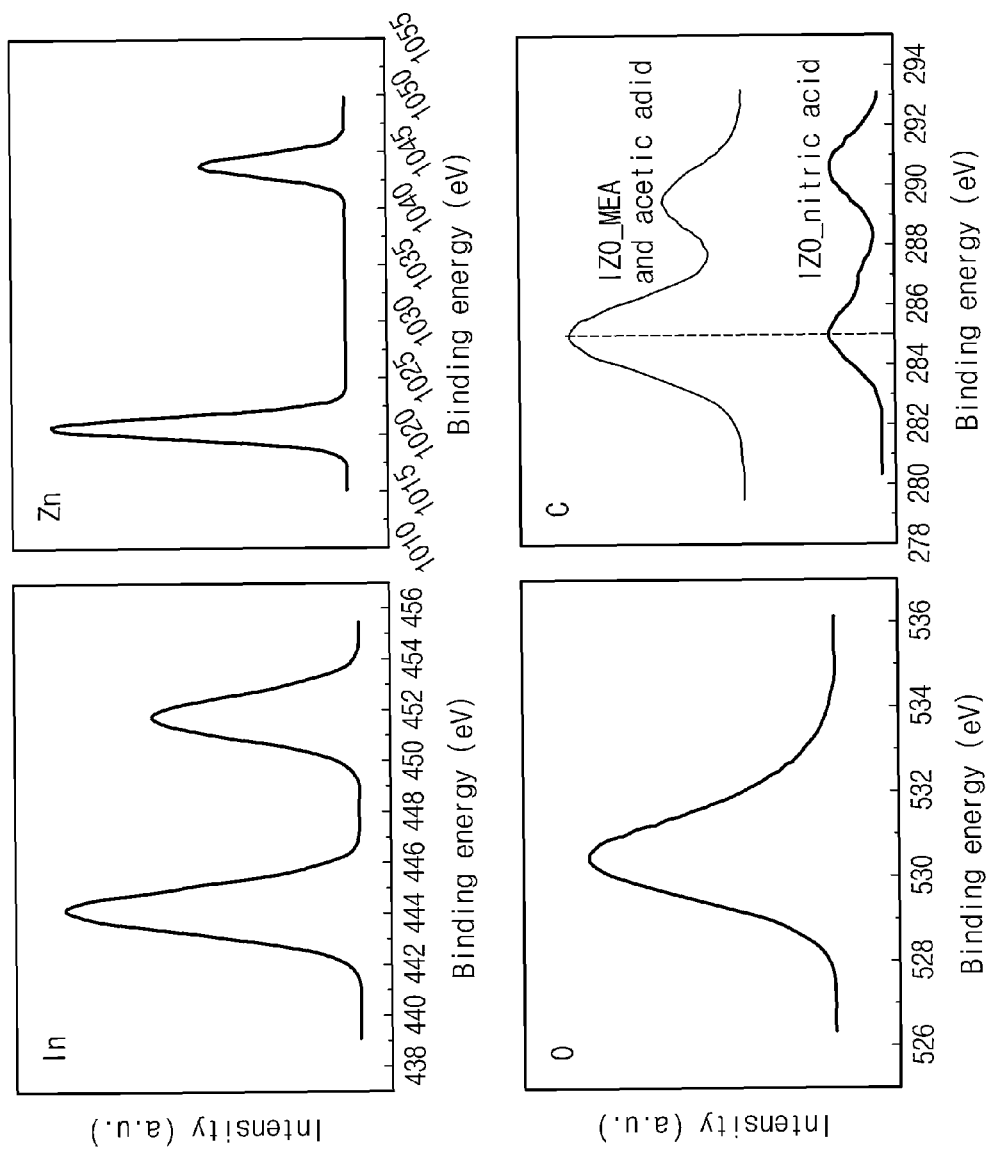
FIG. 2 shows a result of an x-ray photoelectron spectroscopy (XPS) measurement of a InZnO thin film formed using a nitric acid stabilizer according to a first embodiment of the inventive concept and a result of a comparison XPS of residual organic materials within InZnO thin films formed by stabilizers different from each other.

FIG. 2 shows a result of an x-ray photoelectron spectroscopy (XPS) of the IZO thin film formed using the precursor solution for the IZO thin film according to the first embodiment. Referring to FIG. 2, an indium (In) 3d5/2 peak is formed at a binding energy of 443.8 eV, and an In 3d3/2 peak is formed at a binding energy being 7.6 eV greater than 443.8 eV. Thus, it is confirmed that the IZO thin film includes indium (In). And a zinc (Zn) 2p3/2 peak is formed at a binding energy of 1021.45 eV, and a Zn 2p1/2 peak is formed at a binding energy 23.1 eV greater than 1021.45 eV. Thus, it is confirmed that the IZO thin film includes zinc (Zn). Additionally, since a widely spreading peak is formed at a binding energy of 530.5 eV, it is confirmed that indium (In) and zinc (Zn) are oxidized. Furthermore, since the nitric acid stabilizer is added into the oxide solution, the oxide solution has a very low boiling point and does not include an organic material. Thus, an organic material content (i.e., 0.7%) of the IZO thin film formed using the nitric acid stabilizer is very smaller than that of the IZO thin film formed using combination of monoethanolamine (MEA) and acetic acid which is widely used in a conventional art. That is, it is confirmed that the oxide solution including the nitric acid is annealed to form the oxide thin film having a low organic material content. Thus, electrical characteristics of the thin film transistor may be improved. Additionally, it is confirmed that the nitric acid-based stabilizer is one of important factors in the manufacture of a low temperature-based oxide thin film transistor.

Figure 3:
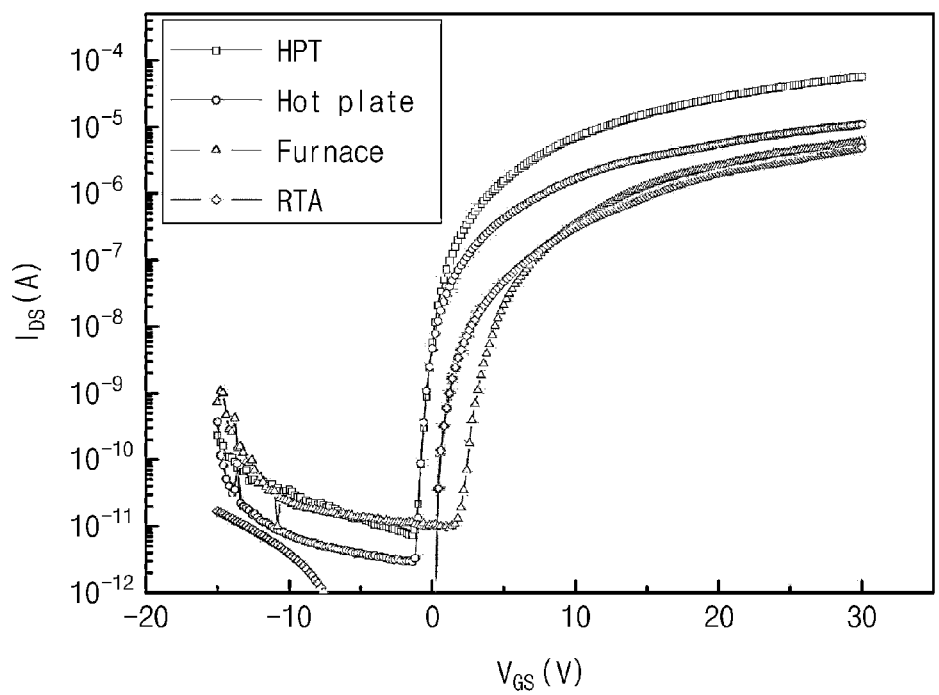
FIG. 3 shows transfer curves of InZnO thin film transistors which are formed using an InZnO solution of a first embodiment under an annealing process of 250° C. by annealing apparatuses different from each other, respectively.

FIG. 3 shows transfer curves of IZO thin film transistors which are formed using the precursor solution of the first embodiment under an annealing process of 250° C. by annealing apparatuses different from each other, respectively. A tube furnace uses an annealing method using convection, a rapid thermal annealing (RTA) apparatus uses an annealing method using radiant heat, a hot plate uses an annealing method using heat conduction, and a HTP uses an annealing method using a high-pressure apparatus. Heat energy transmission by the conduction is more effective than heat energy transmission by convection and radiation. Additionally, since a density of the thin film increases when a high pressure is applied, the electrical characteristics of the thin film transistor may be improved. In the IZO thin film transistor formed by the HTP, a mobility is 1.00 $cm^2/Vs$, a threshold voltage is 7.09, an on/off ratio is $7.78 \times 10^6$, and a gradient of a drain current (Id) is 0.53 V/decade.

Figure 4:
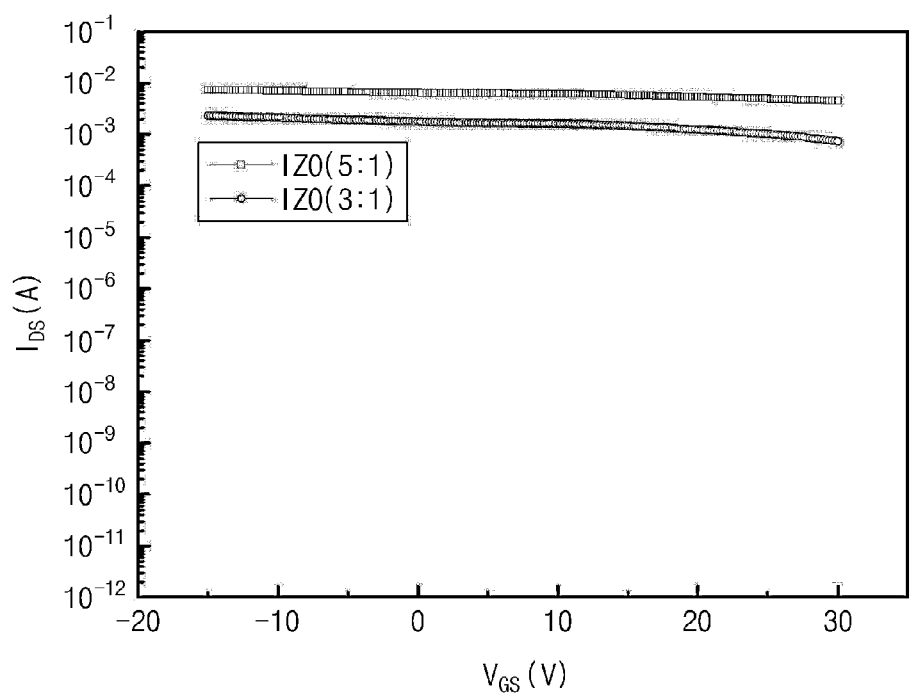
FIG. 4 shows mobility of thin film transistors formed by changing a molar ratio of zinc to indium.

FIG. 4 shows mobility of thin film transistors formed by changing a molar ratio of zinc to indium. As a mole number of zinc increases, the mobility of the tin film transistor increases. For obtaining a conductive thin film, a IZO thin film deposited by the spin coating method was annealed under a vacuum atmosphere at a temperature of 250° C. Since oxygen radical and hydroxyl radical weakly combined with the residual organic material are desorbed under the vacuum atmosphere, the IZO thin film has a very high electron concentration of $10^{19}$ $cm^{-3}$ or more.

Figure 5:
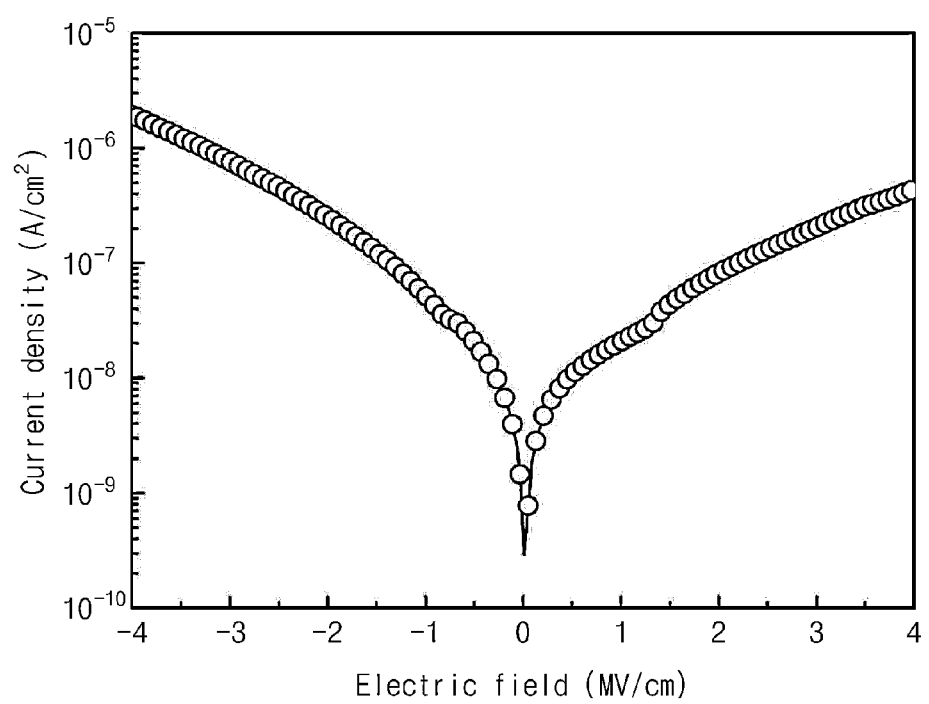
FIG. 5 shows an electrical characteristic curve of an aluminum oxide thin film which is formed by a precursor solution of a third embodiment and a high-pressure annealing process performed under an oxygen atmosphere at a temperature of 250° C.

FIG. 5 shows an electrical characteristic curve of an aluminum oxide thin film which is formed by a precursor solution of the third embodiment and a high-pressure annealing process performed under an oxygen atmosphere at a temperature of 250° C. A dielectric constant of the formed aluminum oxide thin film was 9.8.

Figure 6:
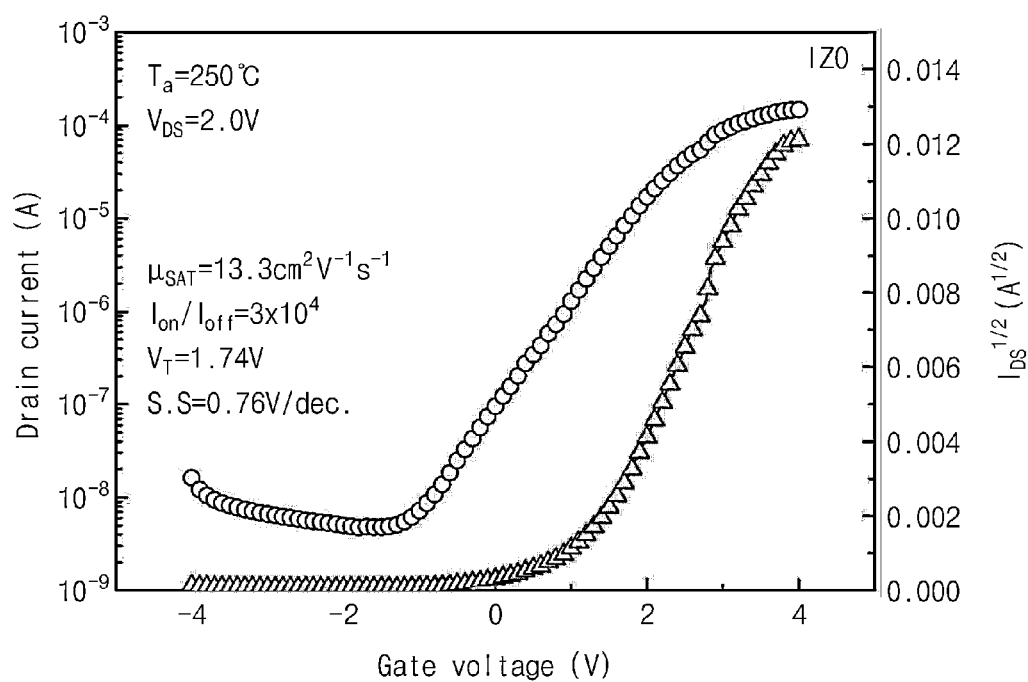
FIG. 6 shows an electrical characteristic curve of a thin film transistor which includes the aluminum oxide thin film of FIG. 5 used as a gate insulating layer, and an oxide semiconductor formed using an IZO solution of a first embodiment and stacked on the aluminum oxide thin film.

FIG. 6 shows an electrical characteristic curve of a thin film transistor which includes the aluminum oxide thin film of FIG. 5 used as a gate insulating layer, and an oxide semiconductor formed using the IZO solution of the first embodiment and stacked on the aluminum oxide thin film. The thin film transistor has an excellent characteristic of a field mobility of 13.3 $cm^2/Vs$.

Figure 7:
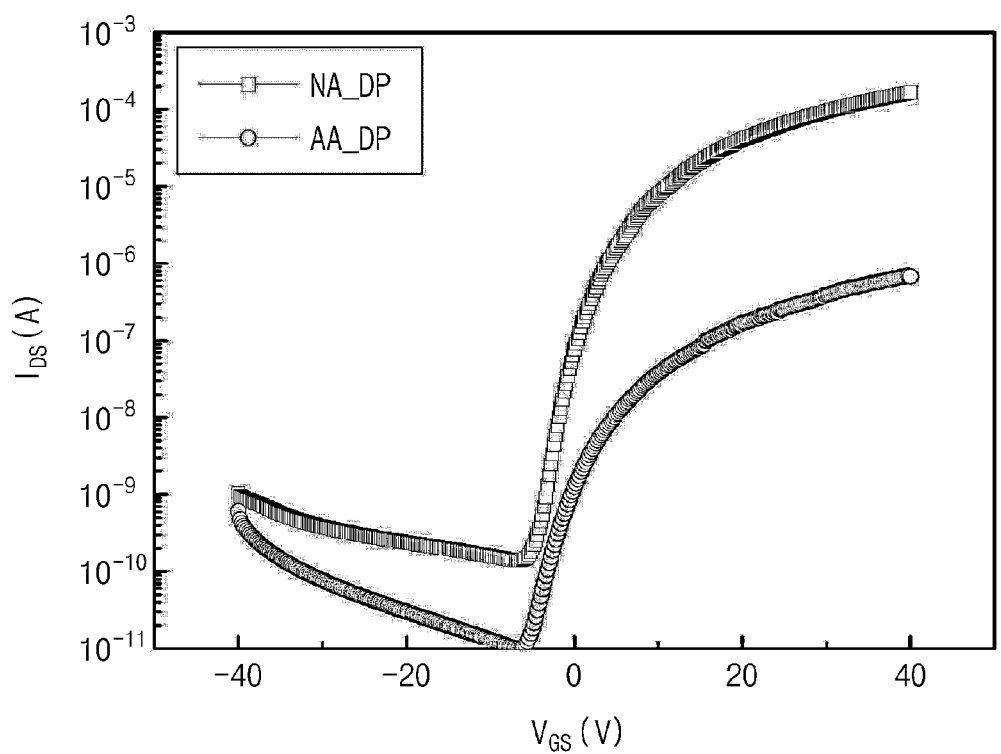
FIG. 7 shows electrical characteristic curves of a thin film transistor formed by a second embodiment and a thin film transistor formed by a comparison embodiment.

FIG. 7 shows electrical characteristic curves of the thin film transistor formed by the second embodiment and the thin film transistor formed by the comparison embodiment. The annealing process was performed under the vacuum atmosphere at a temperature of 200° C. Referring to FIG. 7, a conductivity of the thin film transistor formed using the nitric acid stabilizer according to the inventive concept is greater than that of the thin film transistor formed using acetic acid as the stabilizer.

Figure 8:
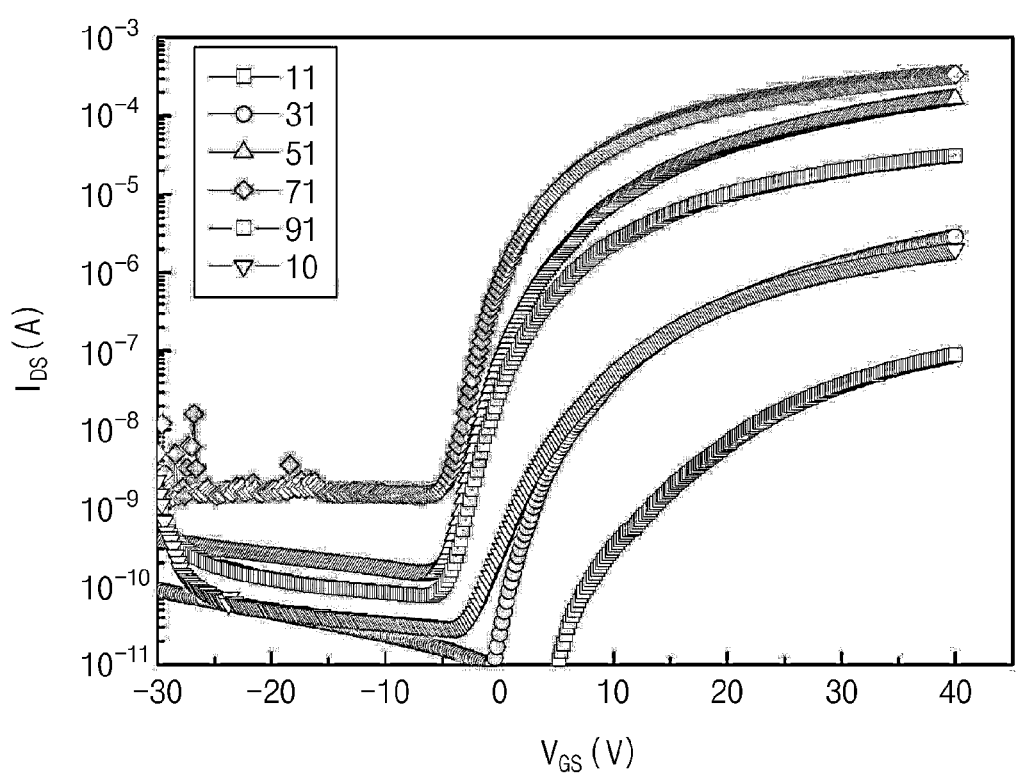
FIG. 8 shows electrical characteristic curves of thin film transistors formed using solutions which are formed by controlling a composition ratio of indium to zinc in a second embodiment within a range of 1:1 to 10:0.

FIG. 8 shows electrical characteristic curves of thin film transistors formed using solutions which are formed by controlling the composition ratio of indium to zinc in the second embodiment within a range of 1:1 to 10:0. The annealing process was performed under the vacuum atmosphere at a temperature of 200° C. A driving current of the thin film transistor increased in the composition ratio of indium to zinc from 1:1 to 7:1. On the other hand, the driving current of the thin film transistor reduced in the composition ratio of indium to zinc from 7:1 to 10:0. An optimized composition ratio of indium to zinc was 5:1 in the embodiments, and the thin film transistor formed using the optimized composition ratio had the mobility of 3.38 $cm^2/Vs$, the threshold voltage of 13.7, the on/off ratio of $1.4 \times 10^6$, and the S-factor of 1.55 V/decade. Additionally, in the output curve of the thin film transistor, the linear region and the saturation region were surely distinguished and the thin film transistor had a high saturation current. Thus, the thin film transistor having excellent characteristics was formed at a low temperature of 200° C.

Figure 9:
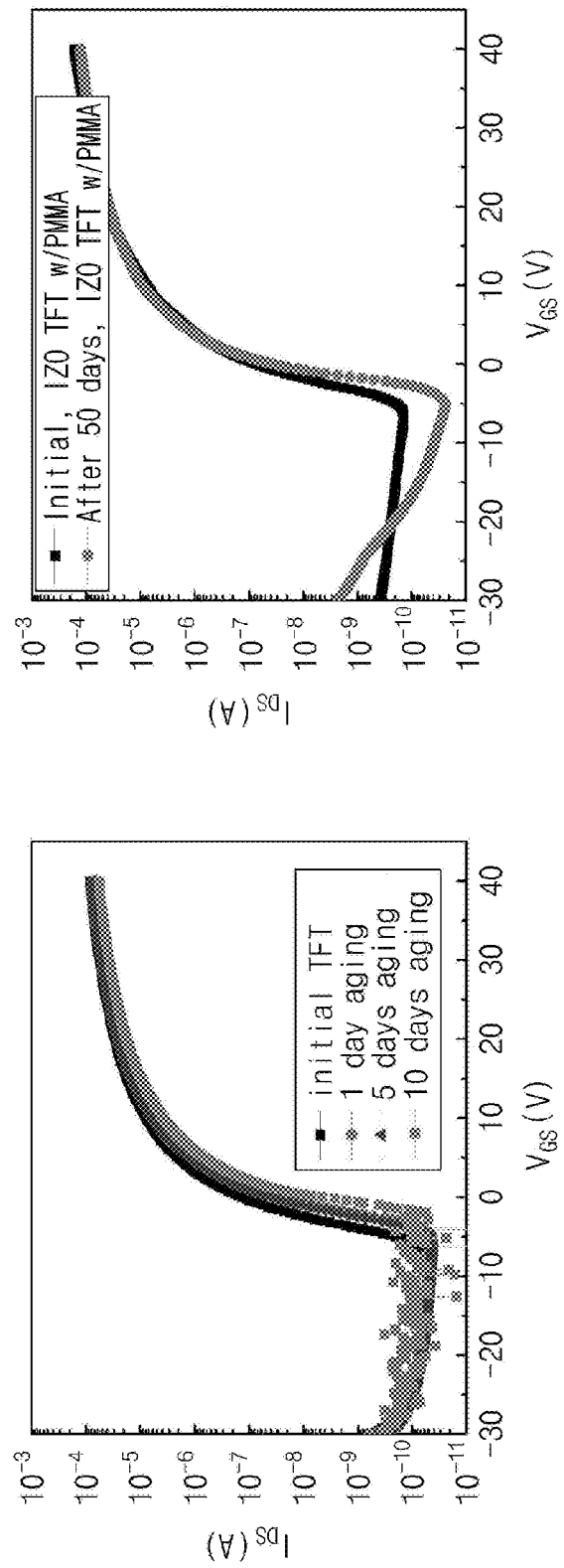
FIG. 9 shows a test result of stability with respect to a remaining time of a thin film transistor formed by an oxide solution having a composition ratio of indium to zinc of 5:1 and not applied with a passivation layer.

FIG. 9 shows a test result of stability with respect to a remaining time of a thin film transistor formed by an oxide solution having a composition ratio of indium to zinc of 5:1 and not applied with a passivation layer. Referring to FIG. 9, as a time passes, the threshold voltage moves a little toward a positive direction, but the driving current of the thin film transistor may not be greatly reduced. Additionally, when characteristic values of the thin film transistor applied with the passivation layer, which were measured 50 days later, may not be greatly different from initial measurement values thereof. Thus, it is confirmed that the stability of the thin film transistor is excellent.

In the embodiments described above, the oxide semiconductor applied to the thin film transistor is described as an example. However, the inventive concept is not limited thereto. The oxide semiconductor according to inventive concept may be applied to electronic devices needing a semiconductor thin film. For example, the oxide semiconductor according to the inventive concept may be used as materials of a resistor, a capacitor, an inductor, and/or a diode and be applied to a display device (e.g., LCD and/or AMOLED) or a solar cell including at least one thereof.

According to embodiments of the inventive concept, the oxide semiconductor may be formed using the solution process, so that the formation method may be simplified and formation costs may be reduced.

According to embodiments of the inventive concept, the oxide thin film may be formed by the low temperature process, so that it is possible to form the electronic device capable of being applied to a large area glass substrate and/or a flexible substrate.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A composition for an oxide thin film, comprising:
   a metal precursor including at least one of a metal nitrate, a metal nitride, and hydrates thereof; and
   a nitric acid-based stabilizer, wherein a molar ratio of the nitric acid-based stabilizer to the metal precursor is 1:1 to 10:1.

2. The composition of claim 1, wherein the nitric acid-based stabilizer includes at least one of nitric acid and ammonium nitrate.

3. The composition of claim 1, wherein a metal of the metal precursor includes at least one of zinc, indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium.

4. The composition of claim 1, further comprising:
   a solvent capable of dissolving the metal precursor,
   wherein the solvent includes at least one of isopropanol, 2-methoxyethanol, dimethylformaldehyde, ethanol, deionized water, methanol, acetylacetone, dimethylamineborane, and acetonitrile.

5. A composition for an oxide thin film, comprising:
   a metal precursor including at least one of a metal nitrate, a metal nitride, and hydrates thereof, wherein a metal of the metal precursor includes at least one of zinc, indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium;
   a nitric acid-based stabilizer, wherein a molar ratio of the nitric acid-based stabilizer to the metal precursor is 1:1 to 10:1; and
   a solvent capable of dissolving the metal precursor, wherein the solvent includes at least one of isopropanol, 2-methoxyethanol, dimethylformaldehyde, ethanol, deionized water, methanol, acetylacetone, dimethylamineborane, and acetonitrile.

6. The composition of claim, 5, wherein the metal precursor includes an indium precursor and a zinc precursor; and
   wherein a molar ratio of the indium precursor to the zinc precursor is 1:1 to 9:1.

7. A composition for an oxide thin film, comprising:
   a metal precursor including at least one of a metal nitrate, a metal nitride, and hydrates thereof, wherein a metal of the metal precursor includes at least one of zinc, indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium, and wherein a molar concentration of the metal precursor is 0.1M to 10M;
   a nitric acid-based stabilizer; and
   a solvent capable of dissolving the metal precursor, wherein the solvent includes at least one of isopropanol, 2-methoxyethanol, dimethylformaldehyde, ethanol, deionized water, methanol, acetylacetone, dimethylamineborane, and acetonitrile.

8. The composition of claim 7, wherein a molar ratio of the nitric acid-based stabilizer to the metal precursor is 1:1 to 10:1.

9. The composition of claim 1, wherein a molar concentration of the metal precursor is 0.1M to 10M.

10. A method for forming an oxide thin film, comprising:
    depositing a composition for the oxide thin film on a substrate, the composition including a metal precursor and a nitric acid-based stabilizer with a molar ratio of the nitric acid-based stabilizer to the metal precursor being 1:1 to 10:1, the metal precursor including at least one of metal nitrate, metal nitride, and hydrates thereof; and
    annealing the substrate having the coated composition at a temperature of 100° C. to 450° C.

11. The method of claim 10, wherein annealing the substrate is performed at a temperature of 200° C. to 300° C.

12. The method of claim 11, wherein depositing the composition for the oxide thin film on the substrate comprises:
    depositing the composition for the oxide thin film on a flexible substrate or a glass substrate.

13. An electronic device comprising:
    an oxide thin film comprising:
       a metal precursor having at least one of a metal nitrate, a metal nitride, and hydrates thereof; and
       a nitric acid-based stabilizer, wherein a molar ratio of the nitric acid-based stabilizer to the metal precursor is 1:1 to 10:1;
    a gate electrode disposed on the oxide thin film; and
    a source electrode and a drain electrode electrically connected to the oxide thin film and disposed at both sides of the gate electrode, respectively.

14. A semiconductor device comprising:
an oxide thin film formed on a flexible substrate or a glass substrate, the oxide thin film comprising:
a metal precursor having at least one of a metal nitrate, a metal nitride, and hydrates thereof; and
a nitric acid-based stabilizer, wherein a molar ratio of the nitric acid-based stabilizer to the metal precursor is 1:1 to 10:1.

* * * * *